(12) United States Patent
Yasuda

(10) Patent No.: US 6,229,774 B1
(45) Date of Patent: May 8, 2001

(54) METHOD AND APPARATUS FOR A PHASE LOCKED LOOP

(75) Inventor: Takeo Yasuda, Yasu-gun (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/235,128

(22) Filed: Jan. 21, 1999

(30) Foreign Application Priority Data

Jan. 21, 1998 (JP) .................................................. 10-009556

(51) Int. Cl.[7] .................................. G11B 5/09; H03L 7/00
(52) U.S. Cl. ............................ 369/47.28; 360/51; 331/25; 327/158; 327/159
(58) Field of Search ........................ 369/47, 50, 124.14, 369/124.05; 360/51; 327/158, 159, 161, 276, 277, 166; 331/25, 17, 1 R

(56) References Cited

U.S. PATENT DOCUMENTS

| | | | |
|---|---|---|---|
| 4,647,984 | * 3/1987 | Suzuki et al. ........................... | 386/18 |
| 4,831,444 | * 5/1989 | Kato ..................................... | 348/578 |
| 4,871,975 | * 10/1989 | Nawata et al. ........................ | 375/326 |
| 4,922,141 | * 5/1990 | Lojgren et al. ....................... | 327/158 |
| 5,764,598 | * 6/1998 | Okayasu ............................... | 368/120 |

* cited by examiner

Primary Examiner—Thang V. Tran
(74) Attorney, Agent, or Firm—Randall J. Bluestone

(57) ABSTRACT

A PLL circuit and a phase locking method for rapidly phase locking a sample signal to a target clock. The phase locked loop (PLL) circuit comprises: a voltage controlled oscillator; an error correction logic circuit for determining a phase difference between a signal output by the voltage controlled oscillator and a target signal; and a controllable variable delay circuit for determining a delay of the signal output of the voltage controlled oscillator instantly on the basis of an initial phase difference that is determined by the error correction logic circuit.

19 Claims, 5 Drawing Sheets

METHOD AND APPARATUS FOR A PHASE LOCKED LOOP

BACKGROUND OF THE INVENTION

1. Field of the Invention

The present invention relates to integrated circuits, and more particularly to a phase locked loop system having a controllable variable delay circuit for controlling a delay of a VCO output signal based on an initial phase difference.

2. Description of Related Art

Storage devices, such as hard disk drives (HDD), magnetot-optical disks (MO) and digital video disks (DVD), have been developed as data storage devices for image data and audio data, and recently their memory capacities and speeds have been increased.

In order to reproduce (read) data from these storage media, a sync clock must be extracted in advance from bit sync detection data on a disk, and a clock of a reproduction circuit must be synchronized with this sync clock. In short, so-called "bit synchronization" must be achieved. Generally, a phase locked loop (PLL) circuit is used to achieve the bit synchronization.

To reproduce data on the HDD, first a bit sync pattern is read from the head part in an area where user data are stored. A reproduction circuit (a read channel) is controlled so that this circuit may sample the bit sync pattern waveform at a specific time, which is determined in advance, in the bit sync pattern. In short, the PLL circuit uses a feedback controller to control the phase and the frequency of a clock so that the read channel performs sampling of the bit sync pattern signal at an appropriate time.

FIG. 1 illustrates a conventional PLL circuit 100. In response to a read gate signal 5, an error correction logic circuit (ECL) 1 compares a value of a sampled read-back signal 6, which is sampled using a clock output by a voltage controlled oscillator (VCO) 2, with a sampling point (target value) that is determined in advance. The ECL 1 identifies a phase difference between the output clock of the VCO 2 and a target clock (a clock used to reproduce an appropriate read-back signal).

The ECL 1 feeds a determined phase difference signal back to a current digital to analog converter (DAC) 3. The current output from the current DAC 3, which varies in accordance with the fed back phase difference signal, flows into a loop filter circuit 4 connected to the input terminal of the voltage controlled oscillator 2. The oscillation frequency and the phase of the voltage controlled oscillator 2 are controlled in accordance with a voltage applied to the loop filter circuit 4. While the feedback control sequence is repeated, the "clock output" by the VCO 2 can be synchronized with the "target clock," which samples the read-back signal 6 at appropriate times. So-called bit synchronization is thus achieved.

In the conventional PLL circuit 100 in FIG. 1, the read gate signal 5 is transmitted to the ECL 1 asynchronously with the sampled read-back signal 6. Therefore, the initial phase difference between the output clock of the VCO 2 and the target clock is ±π at the maximum. The PLL circuit 100 initiates the operation in accordance with the time at which the read gate signal 5 becomes active, in order to reduce the initial phase difference to zero. At this time, how fast the initial phase difference is reduced to zero is important for the early achievement of the bit synchronization.

With the conventional PLL circuit 100, however, for the following reasons, reducing the initial phase difference to zero can require a relatively long period of time. As is described above, the oscillation frequency and the phase of the VCO 2 are controlled using a terminal voltage, which is changed in accordance with the strength of a control current that flows in the loop filter circuit 4 connected to the input terminal of the VCO 2. In other words, the oscillation frequency and the phase of the VCO 2 are controlled with an analog process. Thus, the frequency and the phase of the clock cannot be controlled independently. Even when the frequency of the clock is near the frequency of the target signal, if the strength of the control current is changed to adjust the phase of the clock, the frequency is changed accordingly, and is shifted away from that of the target signal.

FIG. 2 illustrates the time lag of zero cross timings of a frequency error and a phase error in the conventional PLL circuit of FIG. 1. In FIG. 2, as is indicated by the broken lines, sampling is performed for the bit sync pattern at the leading edge of a clock pulse. At the first portion of the clock, the frequency of the PLL clock substantially matches the frequency of a target clock. However, the phase of the PLL clock is delayed relative to that of the target clock. And, the PLL, therefore, advances the phase.

As a result, the leading edge of the PLL clock gradually approaches the leading edge of the target clock (A in FIG. 2). However, since the frequency is also advanced, the next leading edge of the PLL clock advances too far, beyond the leading edge of the target clock (B in FIG. 2). At this time, the PLL delays this advance.

As this control sequence is repeated, the frequency and the phase of the PLL clock match those of the target clock; however, as is shown in FIG. 3, an extended period of time is required for the frequency and the phase to converge on the target. In particular, the convergence is extended when there is a large initial phase difference between the PLL clock and the target clock. In other words, the larger the initial phase difference is, the more time the bit synchronization requires.

SUMMARY OF THE INVENTION

It is, therefore, one object of the present invention to provide a PLL circuit and a phase locking method for rapidly phase locking a PLL output signal to a target clock signal.

It is another object of the present invention to provide a PLL system wherein the frequency and the phase of a sample signal can be adjusted to those of a target signal within a short period of time, even when the initial phase difference is large.

It is an additional object of the present invention to provide a data storage device including a PLL circuit that uses a sampled read-back signal during reproduction of data to synchronize a sample clock with a target clock.

To achieve the above objects, according to the present invention, a phase locked loop (PLL) circuit comprises: a voltage controlled oscillator; an error correction logic circuit for determining a phase difference between a voltage controlled oscillator output signal and a target signal; and a controllable variable delay circuit for determining a delay of the voltage controlled oscillator output signal on the basis of an initial phase difference that is determined by the error correction logic circuit.

A method for phase locking a sample signal to a target signal according to one embodiment of the present invention comprises the steps of: determining an initial phase difference between the sample signal and the target signal; generating a delay selection signal in accordance with the initial phase difference that is determined; and delaying the sample signal in accordance with the delay selection signal.

DETAILED DESCRIPTION OF THE PREFERRED EMBODIMENT

Figure 4:
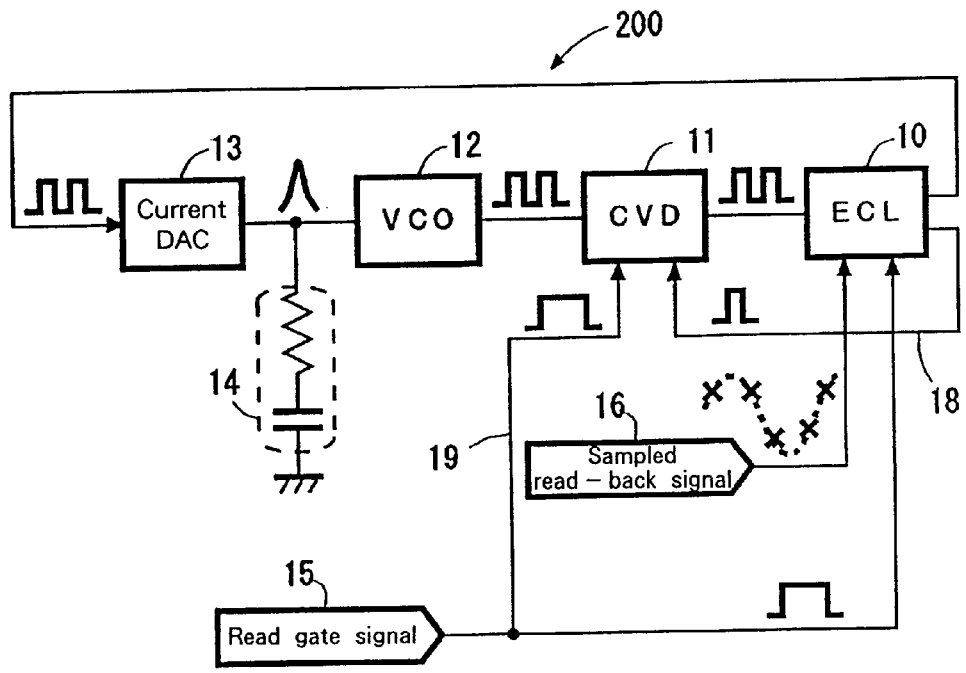
FIG. 4 illustrates an implementation of a PLL circuit according to an embodiment of the present invention.

FIG. 4 illustrates a PLL circuit according to one embodiment of the present invention. In FIG. 4, a PLL circuit 200 comprises: an error correction logic circuit 10, called an ECL; a controllable variable delay circuit 11, called a CVD; a voltage controlled oscillator 12, called a VCO; a current digital to analog converter 13, called a current DAC; and a loop filter circuit 14, including a capacitor and a resistor that are connected to the input terminal of the voltage controlled oscillator 12.

Figure 1:
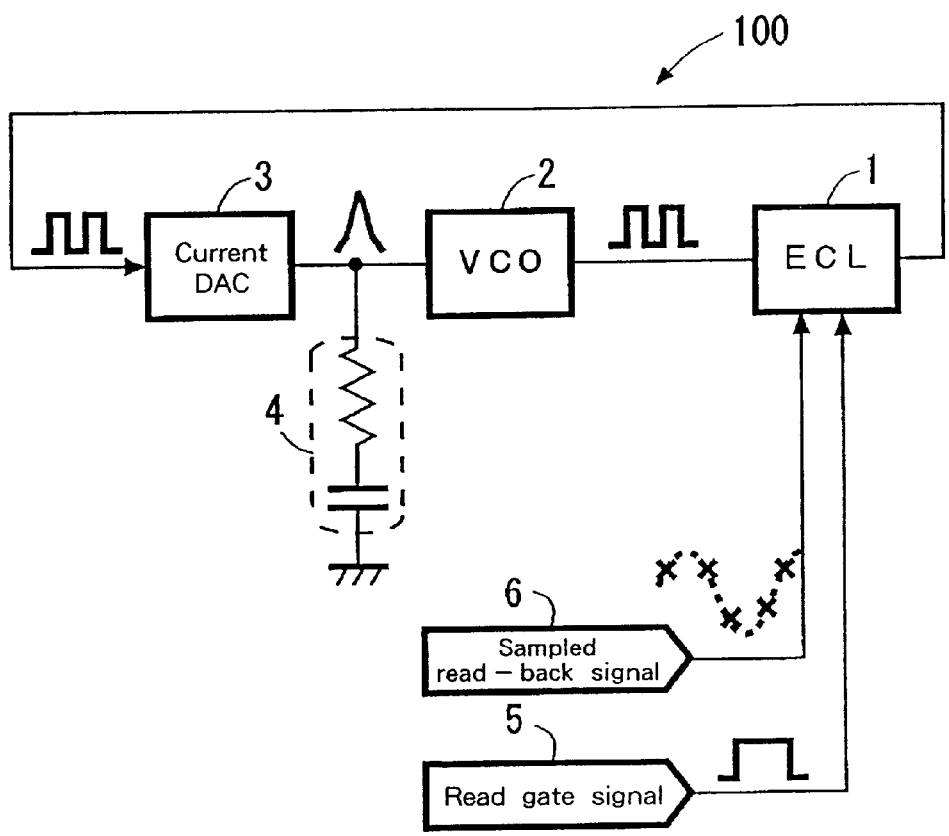
FIG. 1 illustrates a conventional PLL circuit.
Figure 2:
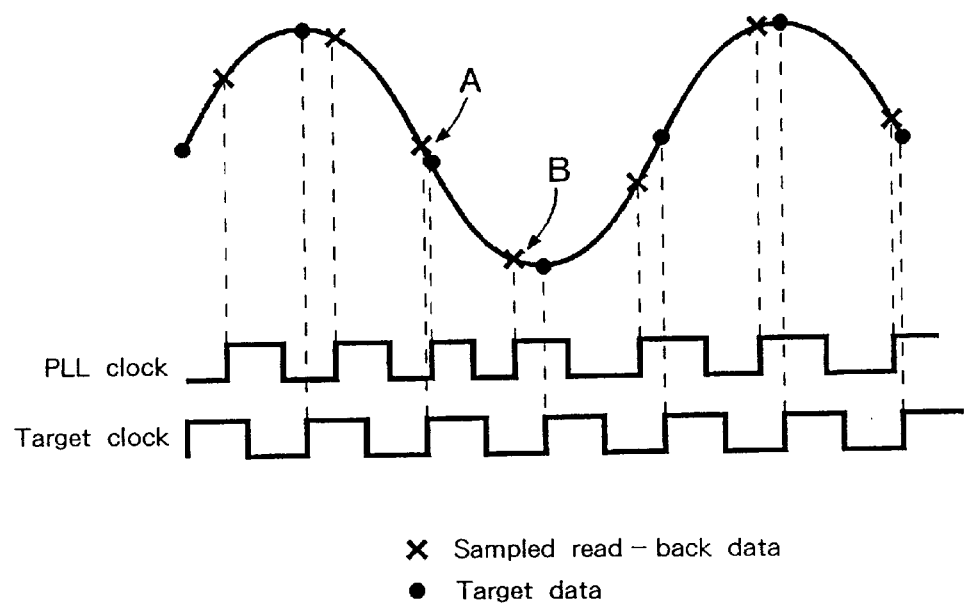
FIG. 2 illustrates the time lag of zero cross timings of a frequency error and a phase error in the conventional PLL circuit of FIG. 1.

Differences between the PLL circuit 200 of the present invention in FIG. 4 and the conventional PLL circuit 100 in FIG. 1 include the controllable variable delay circuit 11, and that a feedback signal line 18 from the error correction logic circuit 10 and an input line 19 which is actually a read gate signal 15 are connected to the controllable variable delay circuit 11.

In operation, a clock signal generated by the VCO 12 is transmitted to the CVD 11. When the read gate signal 15 input across the signal line 19 is active, i.e., when data are to be read from a storage medium, the CVD 11 adds a predetermined initial delay to the received clock signal. The delay time is controlled by a delay selection signal that is transmitted via the feedback signal line 18 from the ECL 10 at the succeeding stage. When the read gate signal 15 is not active, the CVD 11 always adds a "zero" delay to the clock signal. Therefore, when the read gate signal 15 is not active, the CVD 11 outputs the clock signal to the ECL 10 without additional delay.

When the read gate signal 15 is rendered active, the ECL 10 compares a value of sampled read-back signal 16, which has been sampled by using the output clock of the VCO 12, with a sampling point that is determined in advance, i.e., a target value. The ECL 10 then acquires a phase difference between the output clock of the VCO 12 and the target clock (a clock which would sample a read-back signal correctly), which corresponds to a difference between the sampling value and the target value. The phase difference is fed back as a digital value to the current DAC 13. The ECL 10 also transmits to the CVD 11 a delay selection signal based on the initial phase difference, which is acquired at the moment when the read gate signal 15 is rendered active. The delay selection signal is a signal for selecting a necessary delay to cancel the initial phase difference.

Figure 3:
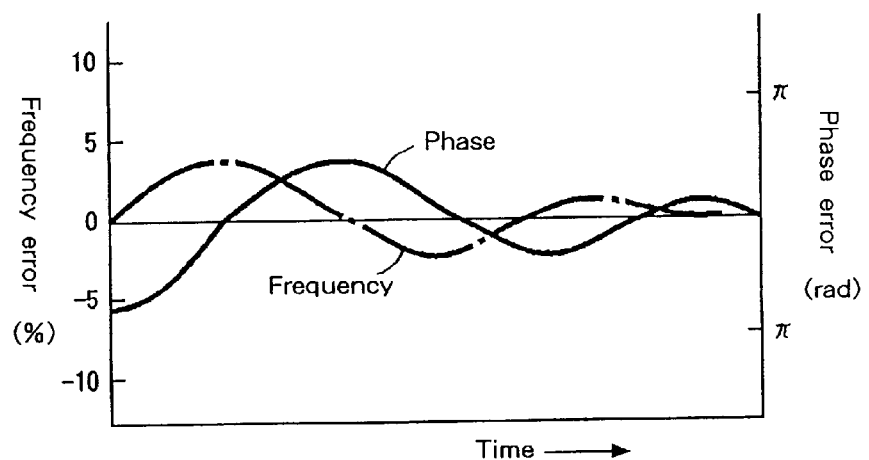
FIG. 3 illustrates a graph of the process required for the frequency and the phase to converge at the target.

The CVD 11 provides the clock signal received from the VCO 12 with a delay that is selected in accordance with a delay selection signal from the ECL 10. As a result, the initial phase difference, of ±π at the maximum, can be reduced until it is as close to zero as possible when the PLL circuit initiates its operation. That is, the phase of the output clock of the VCO 12 can be changed instantaneously without changing the frequency. As a result, the output clock of the VCO 12 can be synchronized with the target clock within an extremely short period of time. In other words, the convergence time in FIG. 3, which is a problem in the prior art, can be considerably reduced.

The current DAC 13 converts a digital value, that corresponds to the phase difference that is fed back from the ECL 10, into an analog current. The current obtained by the current DAC 13 flows in the loop filter circuit 14 connected to the input terminal of the VCO 12. The output voltage of the loop filter circuit 14 varies depending on the amount of the received charge. The oscillation frequency of the VCO 12 is controlled in accordance with the output voltage. The clock signal generated by the VCO 12 is transmitted to the CVD 11. When this feedback control sequence is repeated, the output clock of the VCO 12 is locked to a clock (target clock) with which the read-back signal is sampled correctly to generate a correct sampled read-back signal 16.

Figure 5:
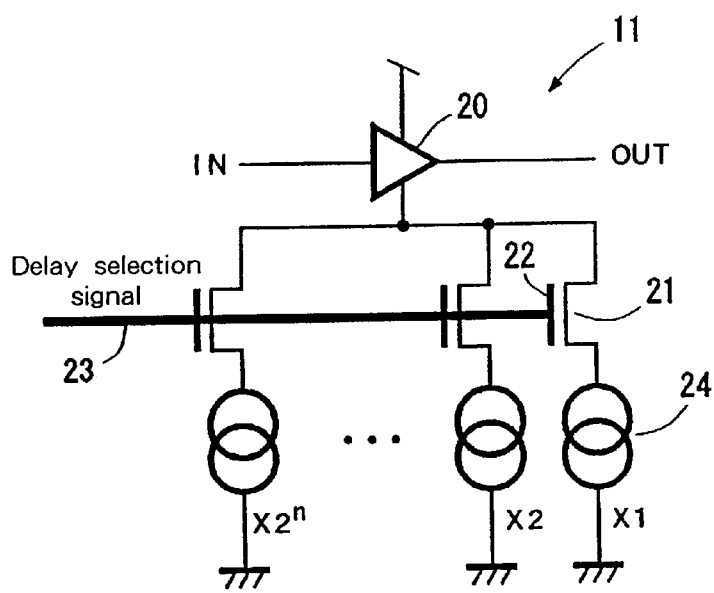
FIG. 5 illustrates an example of a controllable variable delay circuit according to an embodiment of the present invention.

FIG. 5 illustrates an example of CVD 11. The CVD 11 in FIG. 5 comprises a buffer circuit 20, and a plurality of delay circuits that each includes a FET switch 21 and a current source 24 connected in series. The buffer circuit 20 consists of, for example, an inverter. A clock signal received at the buffer circuit 20 is delayed for a period of time that is determined by the amount of a current flowing across the current source 24, and the delayed clock signal is thereafter output by the buffer circuit 20. The FET switch 21 operates as a current switch that is turned on or off in response to a delay selection signal 23 transmitted to a gate 22. The current source 24 can be constituted by a resistor and a transistor; however, a current mirror circuit including a plurality of FETs is preferable as it can provide accurate delay control.

Figure 6:
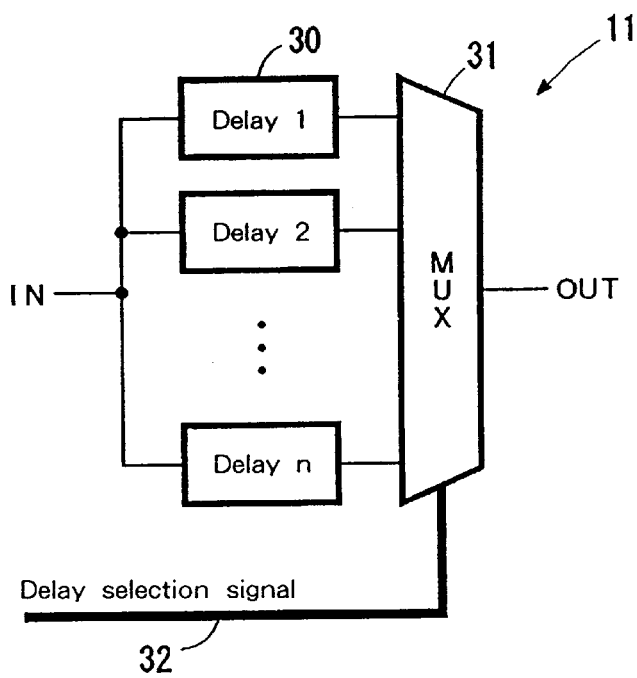
FIG. 6 illustrates another example of a controllable variable delay circuit according to an embodiment of the present invention.

FIG. 6 illustrates another example of the CVD 11. The CVD 11 in FIG. 6 comprises a plurality of parallel connected delay circuits 30 and a multiplexer 31. A clock signal input at each of the delay circuits 30 is delayed a predetermined time and then the resultant clock signal is transmitted to the multiplexer 31. That is, in the CVD 11 in FIG. 6, unlike the CVD 11 in FIG. 5, a plurality of delayed clock signals are transmitted to the multiplexer 31. The delayed clock signals are then selectively outputted from the multiplexer 31 in accordance with a delay selection signal 32. Each delay circuit 30 includes, for example, an inverter and a current source. The inverter provides a constant delay, while the current source provides a variable delay, which is different for each of the different delays 1–n connected in parallel. The CVD 11 in FIG. 6 can more accurately and delicately control a delay than the CVD 11 in FIG. 5 by using the difference of the delay in the process-matched current sources which are variable delay portions in each delay circuit. Therefore this circuit highly effectively controls delay, particularly when the frequency is high and the absolute value for a delay is small.

Figure 7:
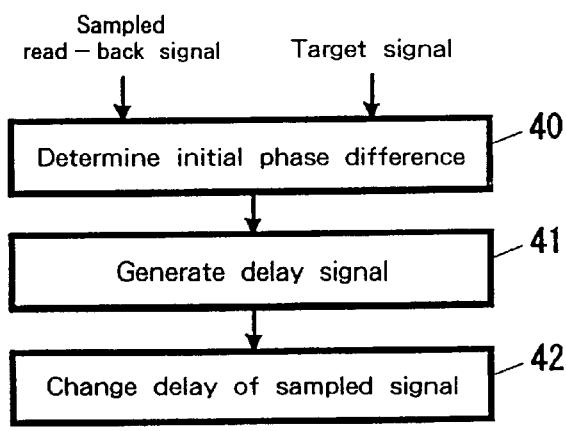
FIG. 7 illustrates a flowchart of a method of phase locking a sample clock to a target clock according an embodiment of the present invention.

FIG. 7 is a flowchart of a method of phase locking a sample clock to a target clock by comparing sampled read-back data and target data. This method is used also for the PLL circuit of the present invention. At step 40, the initial phase difference between a target clock and a sample clock is determined. The target signal is, for example, a signal obtained by sampling, at appropriate times, a bit sync signal used for reading data from a data storage medium. The sample signal is, for example, a sampled read-back signal that is sampled using a voltage controlled oscillator 12 output signal. At step 41, the delay signal is generated in accordance with the determined initial phase difference. The delay signal is a signal for providing a delay to eliminate the determined initial phase difference. At step 42, the delay of the sample signal is changed in accordance with the generated delay signal. The initial phase difference here is a phase difference determined upon the initiation of the reading of data from the storage medium.

Although not described in the flowchart in FIG. 7, a step for performing feedback control for a sample clock oscillator (voltage controlled oscillator) in accordance with the determined phase difference may be included after step 41 as a step to be processed in parallel to step 42.

Figure 8:
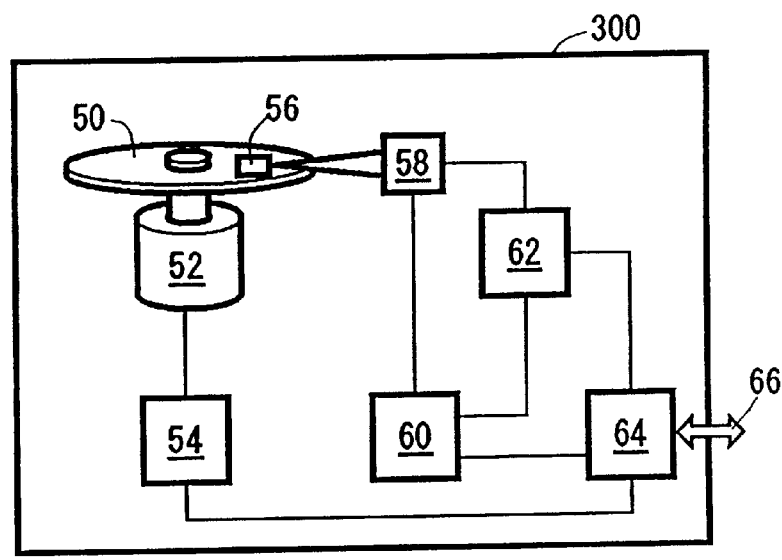
FIG. 8 illustrates a magnetic disk drive that includes a PLL circuit according to an embodiment of the present invention.

FIG. 8 illustrates a magnetic disk drive that uses the PLL circuit 200 of the present invention. The magnetic disk drive 300 comprises: a magnetic disk 50; a spindle motor 52, for rotating the magnetic disk 50; a rotation controller 54, for controlling the rotation of the spindle motor 52; magnetic heads 56, for reading and writing data on the magnetic disk 50; a voice coil motor 58, for moving a head arm to a target track position; a magnetic head controller 60, for controlling the voice coil motor 58; a signal processor 62, for processing signals transmitted by the magnetic heads 56; and a drive controller 64 for controlling the three circuits 54, 60 and 62 and for exchanging a data signal 66 with an external device.

The PLL circuit 200 shown in FIG. 4 is included in the signal processor 62 of the magnetic disk drive 300 in FIG. 8. That is, the PLL circuit 200 in the signal processor 62 can remove the initial phase difference between the output clock of the voltage controlled oscillator and the target clock which would sample a read-back signal from the magnetic disk correctly, and can synchronize (lock) the two clocks within an extremely short period of time.

Figure 9:
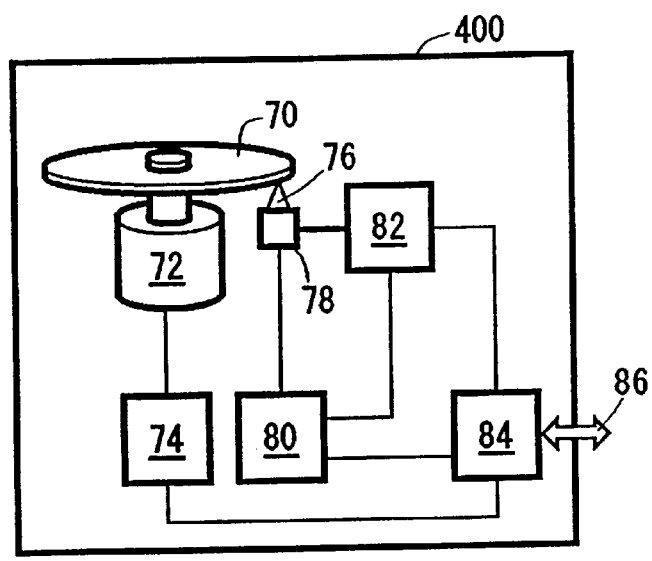
FIG. 9 illustrates an optical disk drive that includes a PLL circuit according to an embodiment of the present invention.

FIG. 9 illustrates an optical disk drive that uses the PLL circuit 200 of the present invention. Optical disk drive 400 comprises: an optical disk 70; a spindle motor 72 for rotating the optical disk 70; a rotation controller 74 for controlling the rotation of the spindle motor 72; an optical pickup 78 for irradiating the optical disk 70 with a light beam 76; an optical pickup controller 80 for controlling the optical pickup 78; a signal processor 82 for processing a signal transmitted by the optical pickup 78; and a drive controller 84 for controlling the three circuits 74, 80 and 82 and for exchanging a data signal 86 with an external device.

The PLL circuit 200 shown in FIG. 4 is included in the signal processor 82 of the optical disk drive 400 in FIG. 9. That is, the PLL circuit 200 in the signal processor 82 can remove the initial phase difference between the output clock of the voltage controlled oscillator and the target clock which would sample a read-back signal from the optical disk correctly, and can synchronize (lock) the two clocks within an extremely short period of time.

As is described above, according to an embodiment of the present invention, to phase lock the sample clock to a target clock, the initial phase difference between the two signals is reduced to zero digitally, and then the sample signal is adjusted to the target signal by the feedback circuit. Therefore, the frequency difference and the phase difference between the sample clock and the target clock can be reduced to zero in an extremely short period of time. In other words, according to an embodiment of the present invention, the phase of the sample clock can be rapidly locked to that of the target clock.

The PLL circuit of the present invention can phase lock two signals without changing any voltage controlled oscillator internal parameters. Therefore, the PLL circuit of the present invention can lock the phase of the sample clock to that of the target clock in a short period of time, without adversely affecting the oscillation state of the oscillator.

The PLL circuit and the phase locking method of the present invention can be applied to a wide range of digital recording devices including, for example: magnetic disk drives, optical disk drives for digital video disks (DVD), CD-ROM drives, optical magneto disk (MO) drives, and magnetic tape drives.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A phase locked loop (PLL) circuit comprising:
   a voltage controlled oscillator (VCO) that outputs a VCO output signal;
   an error correction logic circuit for determining a phase difference between said VCO output signal and a target signal; and
   a controllable variable delay circuit, coupled to said voltage controlled oscillator and said error correction logic circuit, for determining a delay of said VCO output signal on the basis of an initial phase difference that is determined by said error correction logic circuit.

2. The PLL circuit of claim 1, wherein an input of said controllable variable delay circuit is coupled to an output of said voltage controlled oscillator, and an output of said controllable variable delay circuit is coupled to an input of said error correction logic circuit.

3. The PLL circuit of claim 2, wherein said controllable variable delay circuit receives a gate signal, and wherein, while said gate signal is active, said controllable variable delay circuit varies said delay of said VCO output signal on the basis of said initial phase difference determined by said error correction logic circuit.

4. The PLL circuit of claim 3, wherein said controllable variable delay circuit determines the length of said delay of said VCO output signal in accordance with a delay selection signal, which is transmitted from said error correction logic circuit.

5. The PLL circuit of claim 4, wherein said controllable variable delay circuit comprises:
   a buffer circuit for receiving a signal from said voltage controlled oscillator and for outputting to said error correction logic circuit an initially delayed signal;
   at least one switching circuit connected to said buffer circuit to be controlled in accordance with said delay selection signal; and
   a current source connected to said switching circuit.

6. The PLL circuit of claim 5, wherein said switching circuit comprises a plurality of field-effect transistors (FETs)

each having a first terminal connected in parallel to said buffer circuit, and a gate terminal wherein said delay selection signal is connected to said gate terminals of said FETs.

7. The PLL circuit of claim 4, wherein said controllable variable delay circuit comprises:
   a plurality of delay circuits, connected in parallel, for receiving a signal from said voltage controlled oscillator; and
   a multiplexer, coupled to said delay circuits, for receiving signals from said delay circuits and for outputting a selected to delayed signal to said error correction logic circuit in accordance with said delay selection signal.

8. The PLL circuit of claim 7, wherein said plurality of delay circuits each include a buffer circuit and a current source.

9. The PLL circuit of claim 3, wherein said error correction logic circuit receives a gate signal, and wherein while said gate signal is active, said error correction logic circuit determines said initial phase difference between said VCO output signal and a target signal, and transmits a delay selection signal to said controllable variable delay circuit based on said initial phase difference.

10. The PLL circuit of claim 9, wherein said error correction logic circuit transmits said delay selection signal to said controllable variable delay circuit, and transmits to said voltage controlled oscillator a control signal according to said initial phase difference.

11. The PLL circuit of claim 10, wherein said control signal is transmitted to a current digital to analog converter (DAC) and said voltage controlled oscillator is controlled in response to an output signal of said current DAC.

12. The PLL circuit of claim 1, wherein said target signal is a bit sync signal used for reading data from a data storage medium.

13. The PLL circuit of claim 12, wherein said storage medium comprises a magnetic disk.

14. A magnetic disk drive comprising:
   a magnetic disk;
   spindle motor for rotating said magnetic disk;
   a rotation controller for controlling the rotation of said spindle motor;
   magnetic heads for reading and writing data on said magnetic disk;
   a voice coil motor for moving a head arm to a target track position;
   a voice coil motor controller for controlling said voice coil motor;
   a signal processor for processing a signal transmitted from said magnetic heads; and
   a drive controller for exchanging a data signal with an external device, and for controlling said rotation controller, said voice coil motor controller and said signal processor;
   said signal processor including a phase locked loop (PLL) circuit, which comprises:

a voltage controlled oscillator (VCO);
an error correction logic circuit for determining a phase difference between a VCO output signal and a target signal; and
a controllable variable delay circuit for determining a delay of said VCO output signal on the basis of an initial phase difference that is determined by said error correction logic circuit.

15. An optical disk drive comprising:
an optical disk;
a spindle motor for rotating said optical disk;
a rotation controller for controlling the rotation of said spindle motor;
an optical pickup for irradiating said optical disk with a light beam;
an optical pickup controller for controlling said optical pickup;
a signal processor for processing a signal transmitted from said optical pickup; and
a drive controller for exchanging a data signal with an external device, and for controlling said rotation controller, said optical pickup controller and said signal processor;
said signal processor including a phase locked loop (PLL) circuit, which comprises:
a voltage controlled oscillator;
an error correction logic circuit for determining a phase difference between a VCO output signal and a target signal; and
a controllable variable delay circuit for determining a delay of said VCO output signal on the basis of an initial phase difference that is determined by said error correction logic circuit.

16. A method for phase locking a sample signal to a target signal, comprising the steps of:
   determining an initial phase difference between said sample signal and said target signal;
   generating a delay selection signal based on said initial phase difference; and
   initially delaying said sample signal in response to said to delay selection signal.

17. The method of claim 16, wherein said sample signal is a sampled read-back signal that is sampled by using a VCO output signal, and wherein said target signal is a signal obtained by sampling a bit sync signal used for reading data from a data storage medium.

18. The method of claim 16, further comprising a circuit for providing feedback control for said voltage controlled oscillator based on said initial phase difference.

19. The method of claim 16, wherein said initial phase difference is a phase difference that is determined upon initiation of reading of data from said data storage medium.

* * * * *